US012675053B2

(12) United States Patent
Sakurakawa et al.

(10) Patent No.: US 12,675,053 B2
(45) Date of Patent: Jul. 7, 2026

(54) STRUCTURE, EXPOSURE APPARATUS, AND ARTICLE MANUFACTURING METHOD

(71) Applicant: CANON KABUSHIKI KAISHA, Tokyo (JP)

(72) Inventors: Norihiro Sakurakawa, Tochigi (JP); Nobushige Korenaga, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 46 days.

(21) Appl. No.: 18/662,070

(22) Filed: May 13, 2024

(65) Prior Publication Data

US 2024/0393704 A1 Nov. 28, 2024

(30) Foreign Application Priority Data

May 25, 2023 (JP) ................................. 2023-086427

(51) Int. Cl.
*G03F 7/20* (2006.01)
*G03F 7/00* (2006.01)

(52) U.S. Cl.
CPC ...... *G03F 7/70808* (2013.01); *G03F 7/70216* (2013.01); *G03F 7/70716* (2013.01)

(58) Field of Classification Search
CPC ............. G03F 7/70808; G03F 7/70216; G03F 7/70716; G03F 7/70866; G03F 7/709; G03F 7/70825; G03F 7/70833
See application file for complete search history.

(56) References Cited

U.S. PATENT DOCUMENTS

| | | | |
|---|---|---|---|
| 2008/0259299 A1 | 10/2008 | Geerke et al. | |
| 2009/0195760 A1 | 8/2009 | Hempenius et al. | |
| 2011/0032495 A1* | 2/2011 | Shibazaki ............. | G03F 7/7015 |
| | | | 355/53 |
| 2015/0316854 A1 | 11/2015 | Gruner et al. | |
| 2020/0078823 A1 | 3/2020 | Cai et al. | |

FOREIGN PATENT DOCUMENTS

| | | |
|---|---|---|
| EP | 1491690 A1 | 12/2004 |
| JP | 2009182326 A | 8/2009 |
| JP | 2011146727 A | 7/2011 |

OTHER PUBLICATIONS

Extended European Search Report issued in European Appln. No. 24175573.5 mailed Dec. 11, 2024.

* cited by examiner

*Primary Examiner* — Mesfin T Asfaw
(74) *Attorney, Agent, or Firm* — ROSSI, KIMMS & McDOWELL LLP

(57) ABSTRACT

The present invention provides a structure forming a part of an exposure apparatus that includes a stage configured to move on a base while holding an original, and a projection optical system configured to project a pattern image of the original onto a substrate, the structure comprising: a plate arranged between a moving path of the stage and the projection optical system; and a plurality of support members arranged extending along a lower surface of the plate and configured to support the plate by contacting the lower surface.

19 Claims, 16 Drawing Sheets

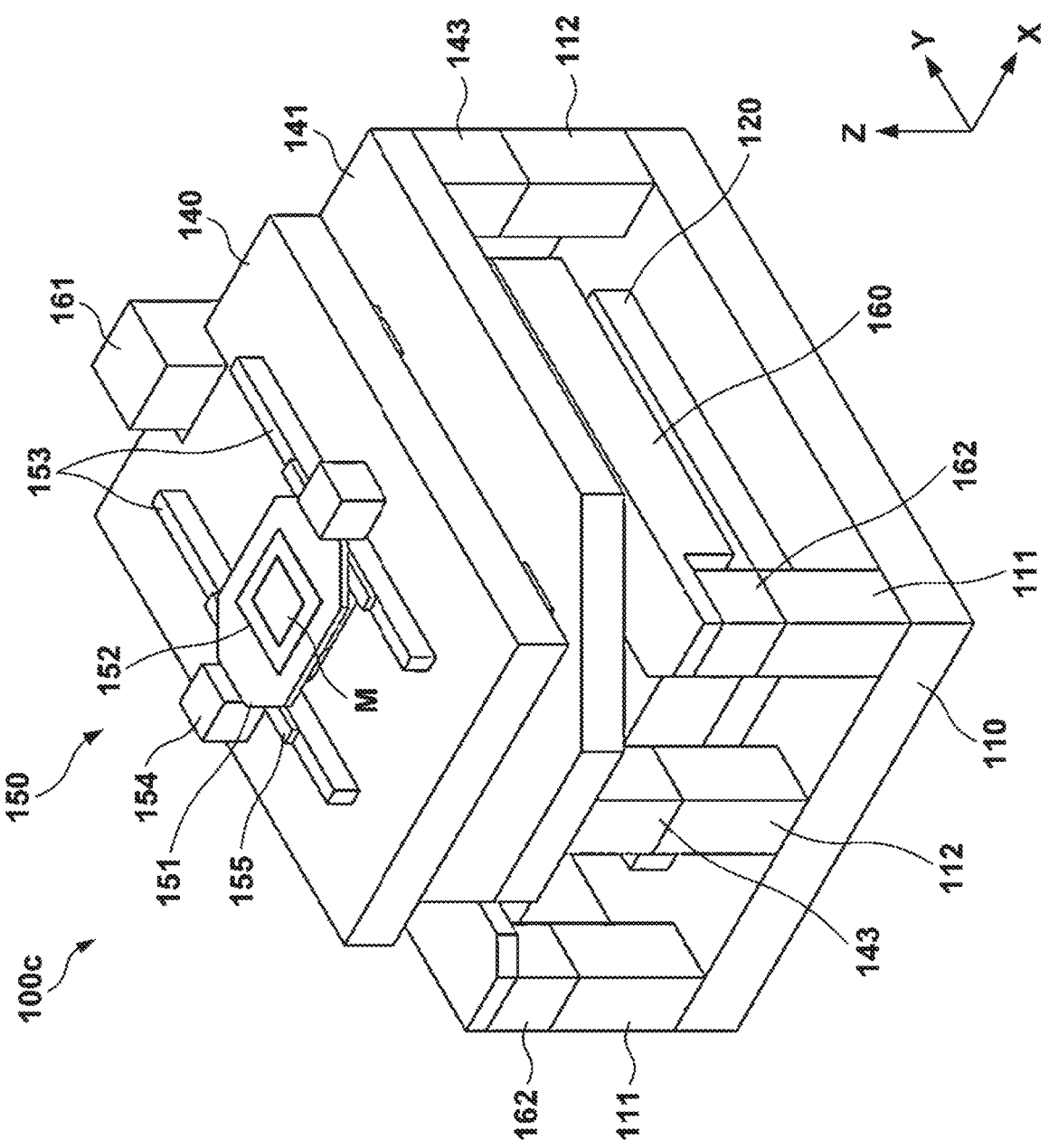
F I G. 8A

F I G. 8B
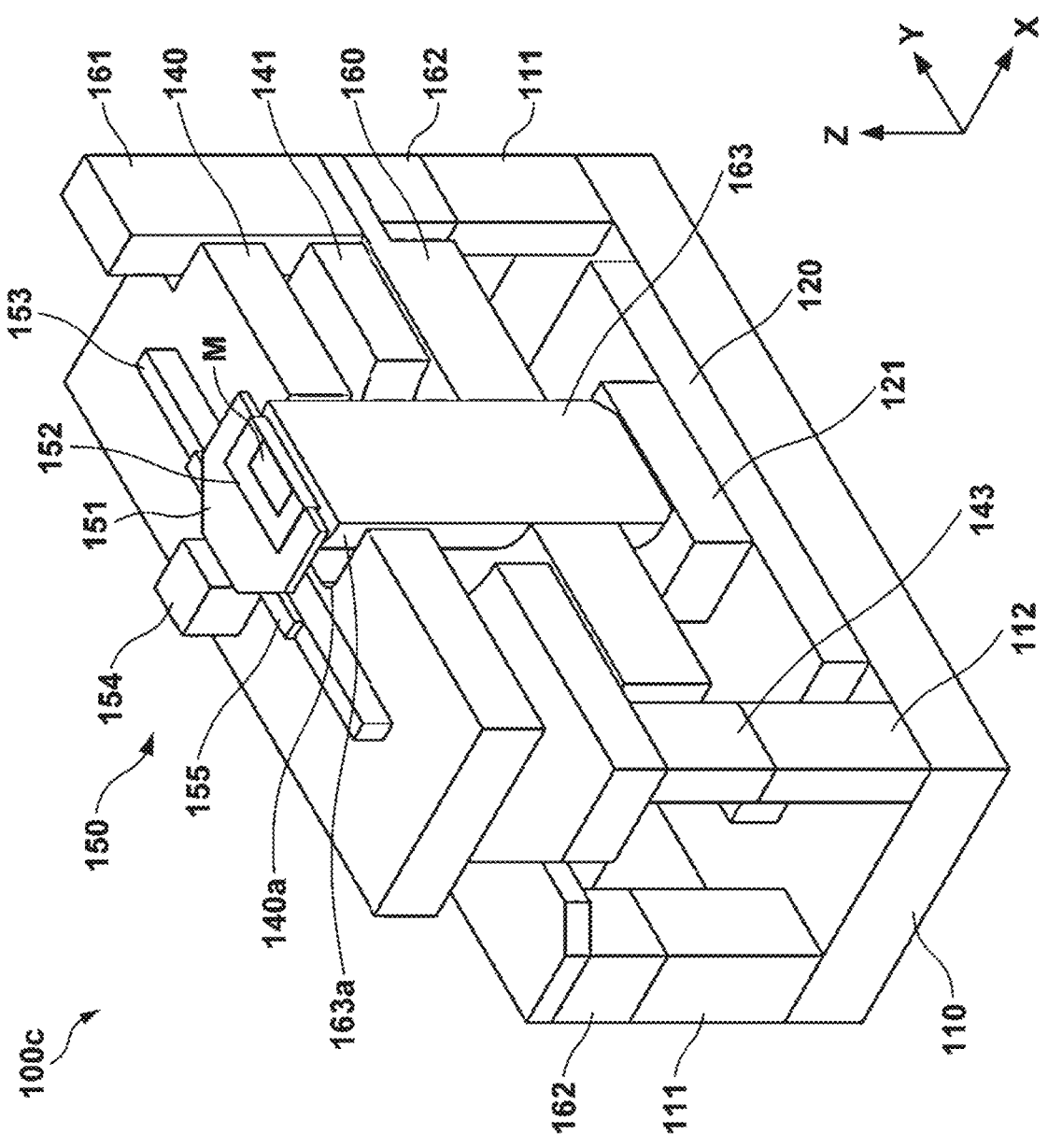

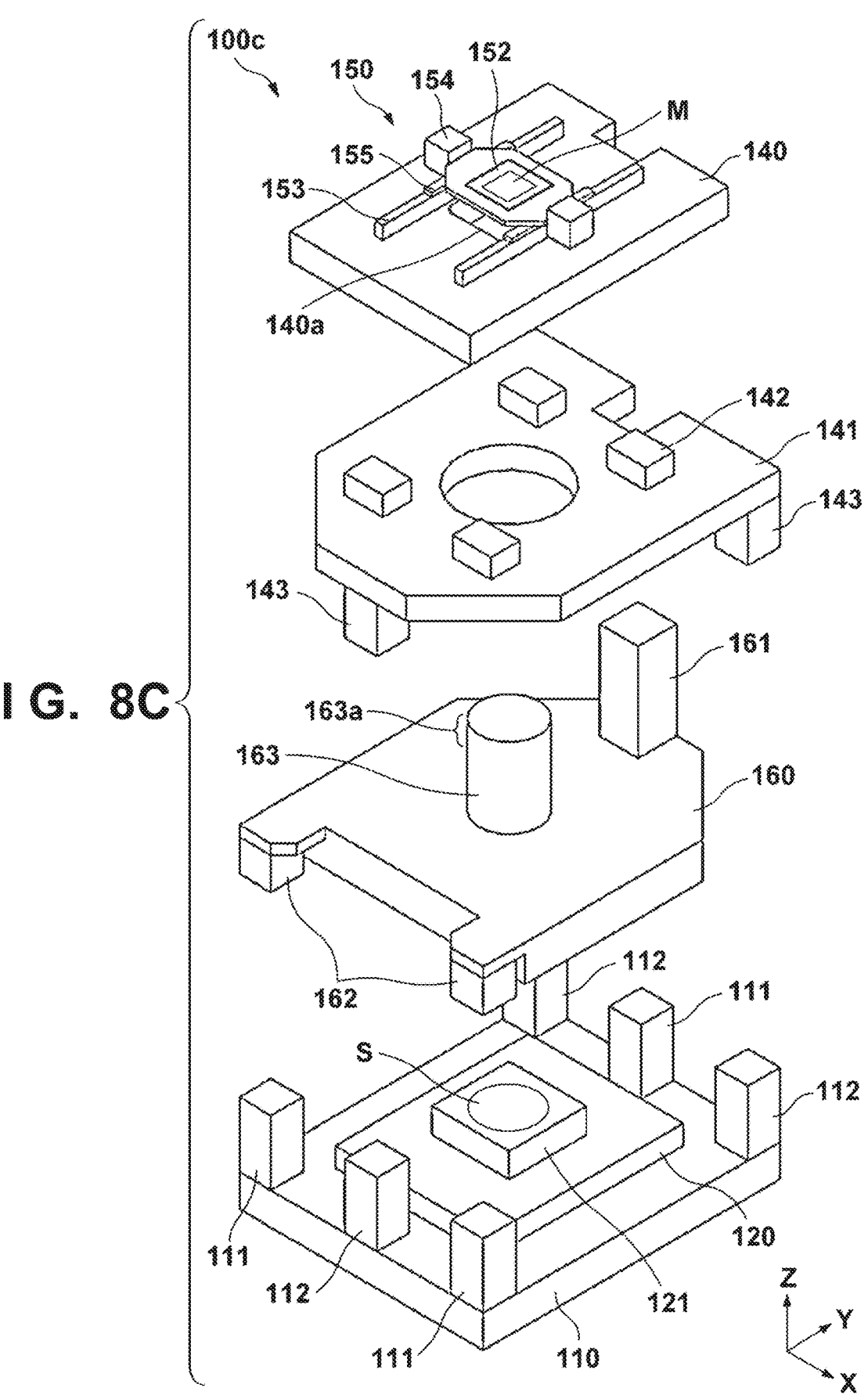
F I G. 8C

F I G. 8F
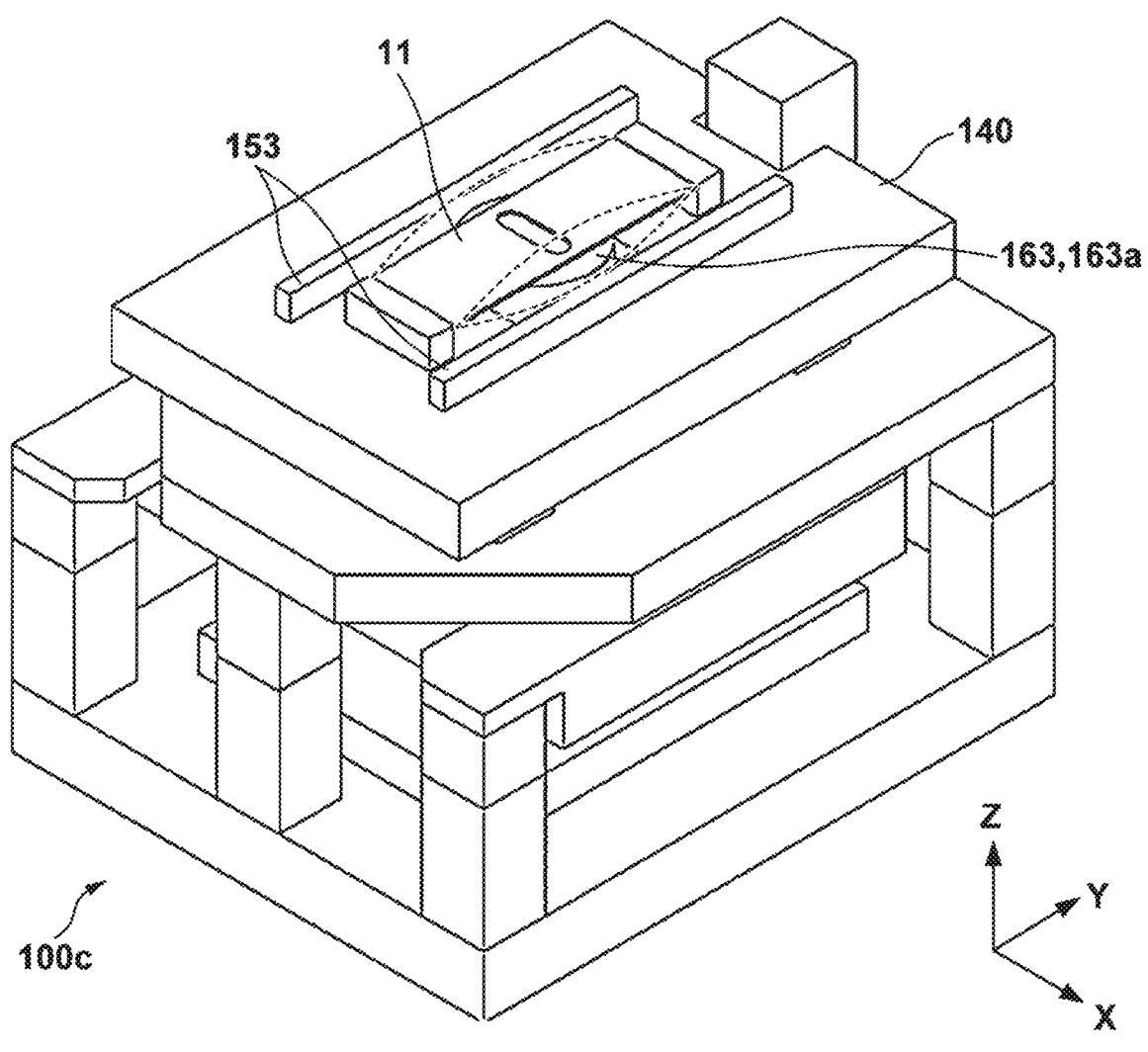

STRUCTURE, EXPOSURE APPARATUS, AND ARTICLE MANUFACTURING METHOD

BACKGROUND OF THE INVENTION

Field of the Invention

The present invention relates to a structure, an exposure apparatus, and an article manufacturing method.

Description of the Related Art

As a lithography apparatus used in a manufacturing process of a semiconductor device or the like, an exposure apparatus is known which exposes a substrate while relatively moving (scanning) an original and the substrate via a projection optical system, thereby transferring the pattern of the original onto the substrate. In such an exposure apparatus, the projection optical system may be vibrated due to a wind pressure generated by movement of a stage holding the original. In this case, it can be difficult to accurately transfer the pattern of the original onto the substrate. Each of Japanese Patent Laid-Open Nos. 2011-146727 and 2009-182326 describes an arrangement in which a shielding plate is provided between a reticle stage and a projection system to reduce excitation of the projection system caused by an airflow and/or a pressure wave generated by movement of the reticle stage.

In the arrangement described in each of Japanese Patent Laid-Open Nos. 2011-146727 and 2009-182326, the shielding plate itself can vibrate due to the airflow and/or the pressure wave generated by movement of the reticle stage. Such vibration of the shielding plate itself can cause vibration of the projection optical system. By increasing the thickness of the shielding plate to increase the rigidity of the shielding plate, excitation of the shielding plate itself can be reduced. However, in this case, the weight of the shielding plate also increases, so that it can become difficult to attach and detach the shielding plate during the manufacture, maintenance, and the like of the apparatus.

SUMMARY OF THE INVENTION

The present invention provides, for example, a technique advantageous in reducing the influence on a projection optical system by a wind pressure generated by movement of a stage.

According to one aspect of the present invention, there is provided a structure forming a part of an exposure apparatus that includes a stage configured to move on a base while holding an original, and a projection optical system configured to project a pattern image of the original onto a substrate, the structure comprising: a plate arranged between a moving path of the stage and the projection optical system; and a plurality of support members arranged extending along a lower surface of the plate and configured to support the plate by contacting the lower surface.

Further aspects of the present invention will become apparent from the following description of exemplary embodiments with reference to the attached drawings.

BRIEF DESCRIPTION OF THE DRAWINGS

FIG. 8A is a view (overall perspective view) showing an example of the arrangement of a conventional exposure apparatus;

FIG. 8B is a view (sectional perspective view) showing the example of the arrangement of the conventional exposure apparatus;

FIG. 8C is a view (exploded perspective view) showing the example of the arrangement of the conventional exposure apparatus;

FIG. 8F is a view for explaining that a plate itself vibrates due the wind pressure.

DESCRIPTION OF THE EMBODIMENTS

Figure 1A:
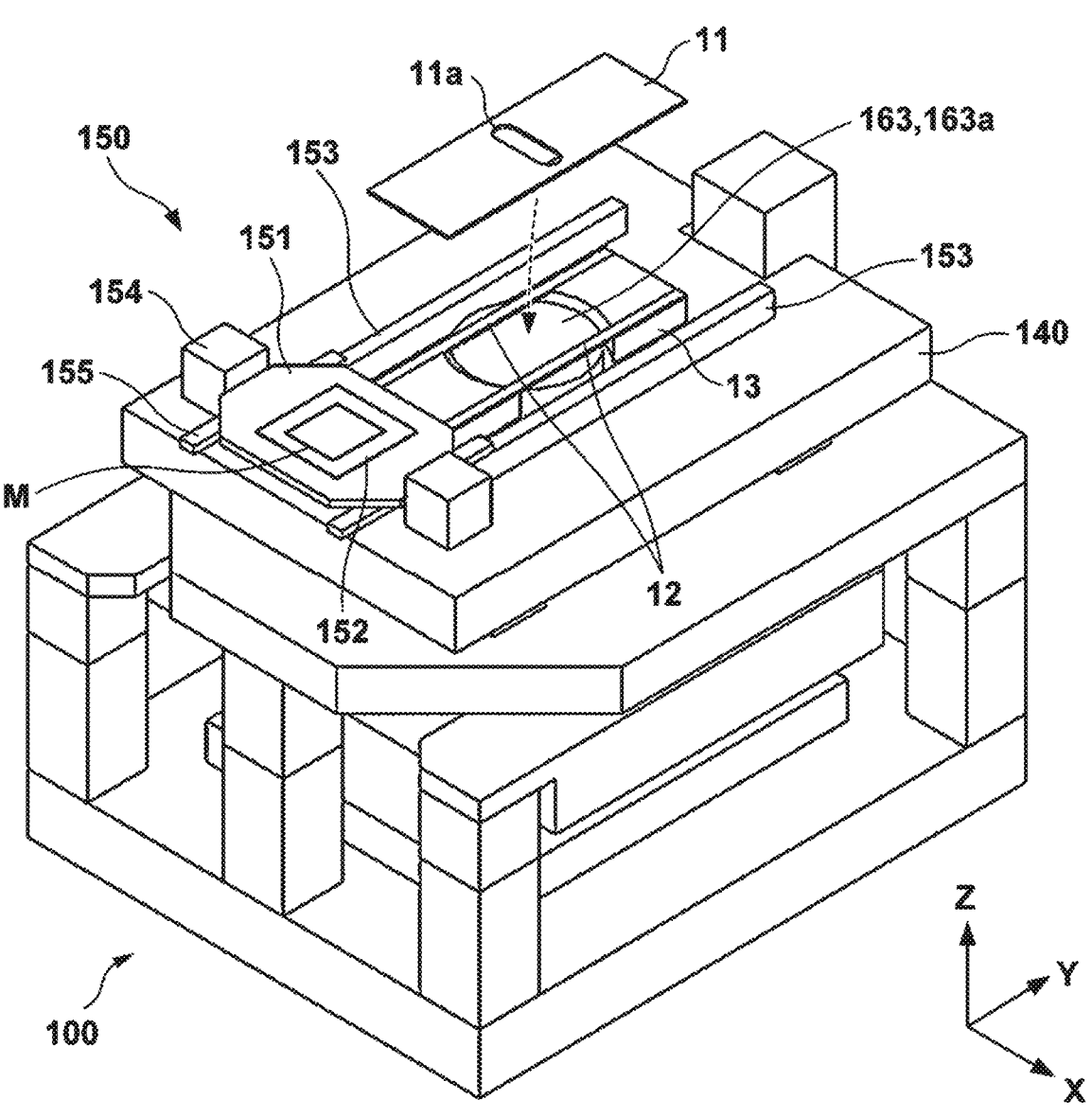
FIG. 1A is a view (overall perspective view) showing an example of the arrangement of an exposure apparatus according to the first embodiment.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

In the specification and the accompanying drawings, directions will be indicated on an XYZ coordinate system in which a direction parallel to the optical axis of a projection optical system is defined as the Z direction and the direction (scanning direction) in which an original moves is defined as the Y direction. Directions parallel to the X-axis, the Y-axis, and the Z-axis of the XYZ coordinate system are the X direction, the Y direction, and the Z direction, respectively. A rotation about the X-axis, a rotation about the Y-axis, and a rotation about the Z-axis are OX, OY, and OZ, respectively. Control or driving (movement) concerning the X-axis, the Y-axis, and the Z-axis means control or driving (movement) concerning a direction parallel to the X-axis, a direction parallel to the Y-axis, and a direction parallel to the Z-axis, respectively. In addition, control or driving concerning the OX-axis, the OY-axis, and the OZ-axis means control or driving concerning a rotation about an axis parallel to the X-axis, a rotation about an axis parallel to the Y-axis, and a rotation about an axis parallel to the Z-axis, respectively.

An exposure apparatus is a lithography apparatus that is used in a manufacturing process of a device such as a semiconductor element and forms a pattern on a substrate. The exposure apparatus can generally include an original stage that moves while holding an original (for example, mask or reticle), a projection optical system that projects the pattern image of the original onto a substrate, and a substrate stage that moves while holding the substrate (for example, wafer). The exposure apparatus can transfer the pattern image of the original onto the substrate by exposing the substrate while relatively moving (scanning) the original and the substrate by the original stage and the substrate stage.

Figure 8D:
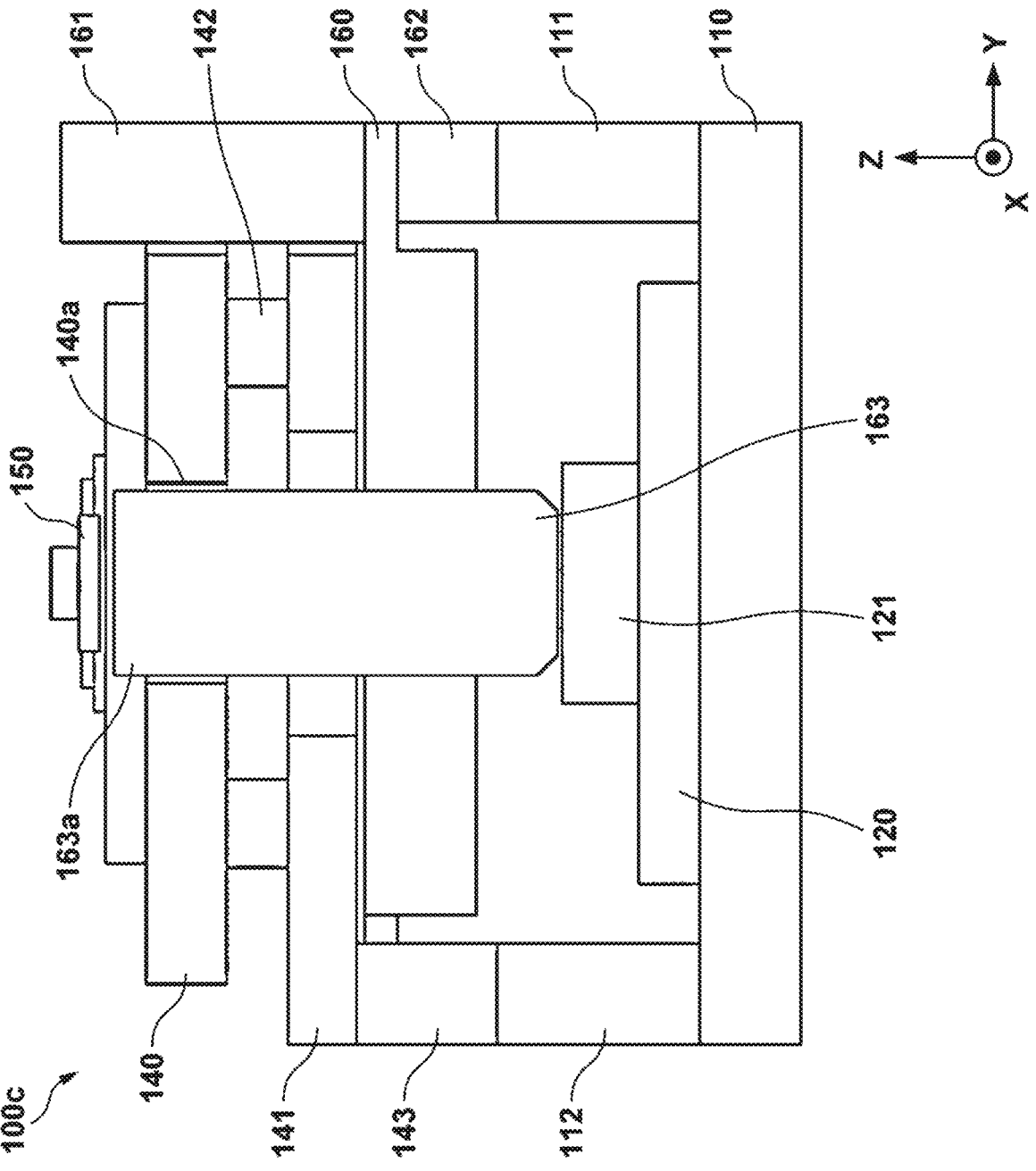
FIG. 8D is a view (sectional view) showing the example of the arrangement of the conventional exposure apparatus.

First, an example of the arrangement of a conventional exposure apparatus 100c will be described with reference to FIGS. 8A to 8D. FIGS. 8A to 8D are views showing an example of the arrangement of the conventional exposure apparatus 100c. FIG. 8A is an overall perspective view, FIG. 8B is a sectional perspective view, FIG. 8C is an exploded perspective view, and 8D is a sectional view.

In the conventional exposure apparatus 100c, a base frame lower plate 110 is arranged in the lowermost portion, and three first base frame supports 111 and three second base frame supports 112 are fixed on the base frame lower plate 110. A substrate stage base 120 is also fixed onto the base frame lower plate 110, and a substrate stage 121 is arranged on the substrate stage base 120. The substrate stage 121 is configured to be movable in the X and Y directions on the substrate stage base 120 while holding a substrate S.

On the three first base frame supports 111, a lens barrel base 160 supporting a projection optical system 163 is arranged via dampers 162. By providing the dampers 162 between the first base frame supports 111 and the lens barrel base 160, the vibration transmitted from the floor where the exposure apparatus 100c is installed to the lens barrel base 160 and the projection optical system 163 is reduced. Further, an interferometer support 161 is fixed to the lens barrel base 160. An interferometer for measuring the position of an original stage 150 can be fixed to the interferometer support 161.

A bridge base 141 is arranged on the three second base frame supports 112 via leg members 143. The leg member 143 desirably has a damping function so that the vibration transmitted from the floor where the exposure apparatus 100c is installed to the bridge base 141 is reduced. Four adjusters 142 are provided on the bridge base 141, and an original stage base 140 is arranged on the adjusters 142. Each of the four adjusters 142 includes an actuator for driving the original stage base 140 in the Z direction, and configured to adjust the posture of the original stage base 140 in the OX direction and/or the OY direction. With this, the relative posture between the original stage base 140 and the projection optical system 163 can be appropriately adjusted. Note that in the example shown in FIGS. 8A to 8D, the four adjusters 142 are provided, but the number of the adjusters 142 is not limited to four. It is sufficient to provide at least three adjusters.

The projection optical system 163 is arranged extending through the original stage base 140 so as to have a protrusion portion 163a protruding from the original stage base 140 toward the side of the original. More specifically, the original stage base 140 is provided with a through hole 140a where the projection optical system 163 extends through.

The projection optical system 163 is arranged such that its upper portion protrudes as the protrusion portion 163a from the through hole 140a toward the side of the original.

The original stage 150 is arranged on the original stage base 140. The original stage 150 is configured to be movable in the Y direction on the original stage base 140 (on the base) while holding an original M. In the example shown in FIGS. 8A to 8D, the original stage 150 is formed by a coarse moving stage 151 and a fine moving stage 152.

The coarse moving stage 151 can be driven by a linear motor including stators 153 and movers 154. Each stator 153 includes a plurality of coils arrayed along a direction (scanning direction or Y direction) in which the coarse moving stage 151 moves, and functions as a guide rail that guides movement of the coarse moving stage 151. In the following description, the stator 153 is sometimes referred to as the "guide rail 153". The guide rail 153 extends along a direction in which the coarse moving stage 151 moves, and two guide rails 153 are arranged on the original stage base 140. The two guide rails 153 are arranged spaced apart from each other in a direction (for example, X direction) orthogonal to (intersecting) a direction in which the original stage 150 moves so as to sandwich the protrusion portion 163a of the projection optical system 163 protruding from the original stage base 140 (through hole 140a). The mover 154 is fixed to the coarse moving stage 151.

When a current flows through the coil of the guide rail 153 (stator), a thrust is generated between the guide rail 153 (stator) and the mover 154. With this, the coarse moving stage 151 can be moved in the Y direction along the guide rail 153. Further, the coarse moving stage 151 is provided with air sliders 155 (air bearings) that make the coarse moving stage 151 float from the guide rails 153. The air sliders 155 can implement smooth movement of the coarse moving stage 151.

The fine moving stage 152 is configured to be movable on the coarse moving stage 151 while holding the original M. The fine moving stage 152 can accurately move in a shorter stroke than the coarse moving stage 151. The position (for example, Y direction) and posture (for example, OX direction, OY direction, and OZ direction) of the fine moving stage 152 are measured by an interferometer (not shown) provided in the interferometer support 161.

The exposure apparatus 100c formed as described above illuminates the original M held by the original stage 150 with slit-shaped light (to be sometimes referred to as slit light hereinafter) emitted from an illumination optical system (not shown). The pattern image of the region of the original M illuminated with the slit light is projected onto the substrate S by the projection optical system 163. By exposing the substrate S while relatively moving (scanning) the original M and the substrate S in synchronization with each other by the original stage 150 and the substrate stage 121, the pattern image of the original M can be transferred onto the substrate S. This process is called scanning exposure, and executed for each of a plurality of shot regions of the substrate S.

Figure 8E:
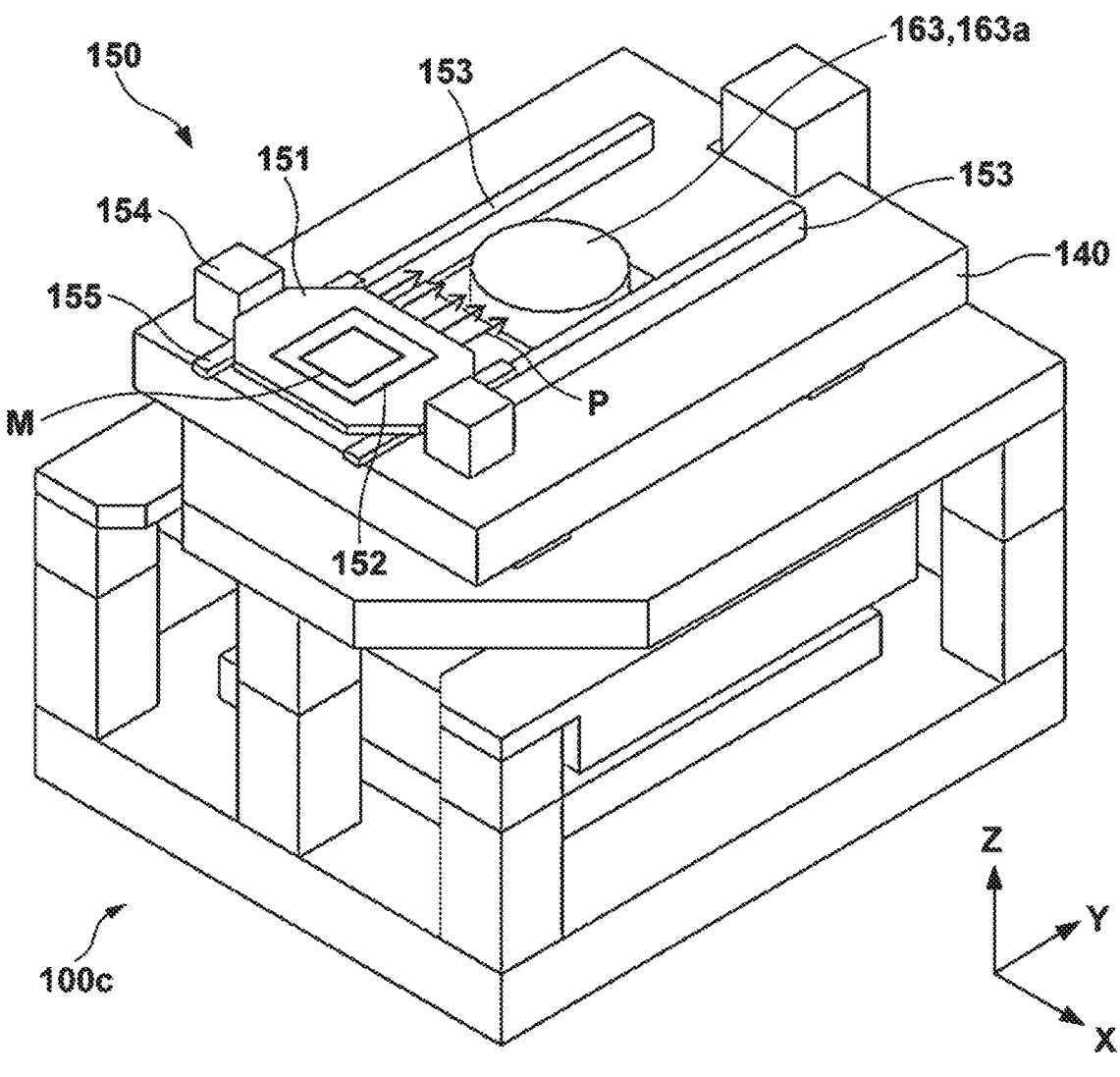
FIG. 8E is a view for explaining a wind pressure generated by movement of an original stage.

In the exposure apparatus 100c, as shown in FIG. 8E, a wind pressure P generated by movement of the original stage 150 can cause vibration of the projection optical system 163. In this case, it can be difficult to accurately transfer the pattern image of the original M onto the substrate S. Particularly, the projection optical system 163 easily receives the wind pressure P generated by movement of the original stage 150 since the projection optical system 163 is arranged such that the upper portion (protrusion portion 163a) protrudes from the original stage base 140. As one countermeasure, as shown in FIG. 8F, it is conceivable to provide, between the moving path of the original stage 150 and the projection optical system 163, a plate 11 for reducing the influence of the wind pressure P on the projection optical system 163. However, if the plate 11 is simply provided, as shown by broken lines in FIG. 8F, the plate 11 itself may vibrate due to the wind pressure P generated by movement of the original stage 150, and the vibration of the plate 11 can cause vibration of the projection optical system 163. By increasing the thickness of the plate 11 to increase the rigidity of the plate 11, excitation of the plate 11 itself can be reduced. However, in this case, the weight of the plate 11 also increases, so that it can become difficult to attach and detach the plate 11 during the manufacture, maintenance, and the like of the apparatus.

To solve this problem, in an exposure apparatus 100 according to the present invention, in addition to the plate 11 arranged between the moving path of the original stage 150 and the projection optical system 163, a plurality of support members 12 that support the plate 11 by contacting the lower surface of the plate 11 are provided. Embodiments of the exposure apparatus 100 according to the present invention will be described below.

First Embodiment

Figure 1B:
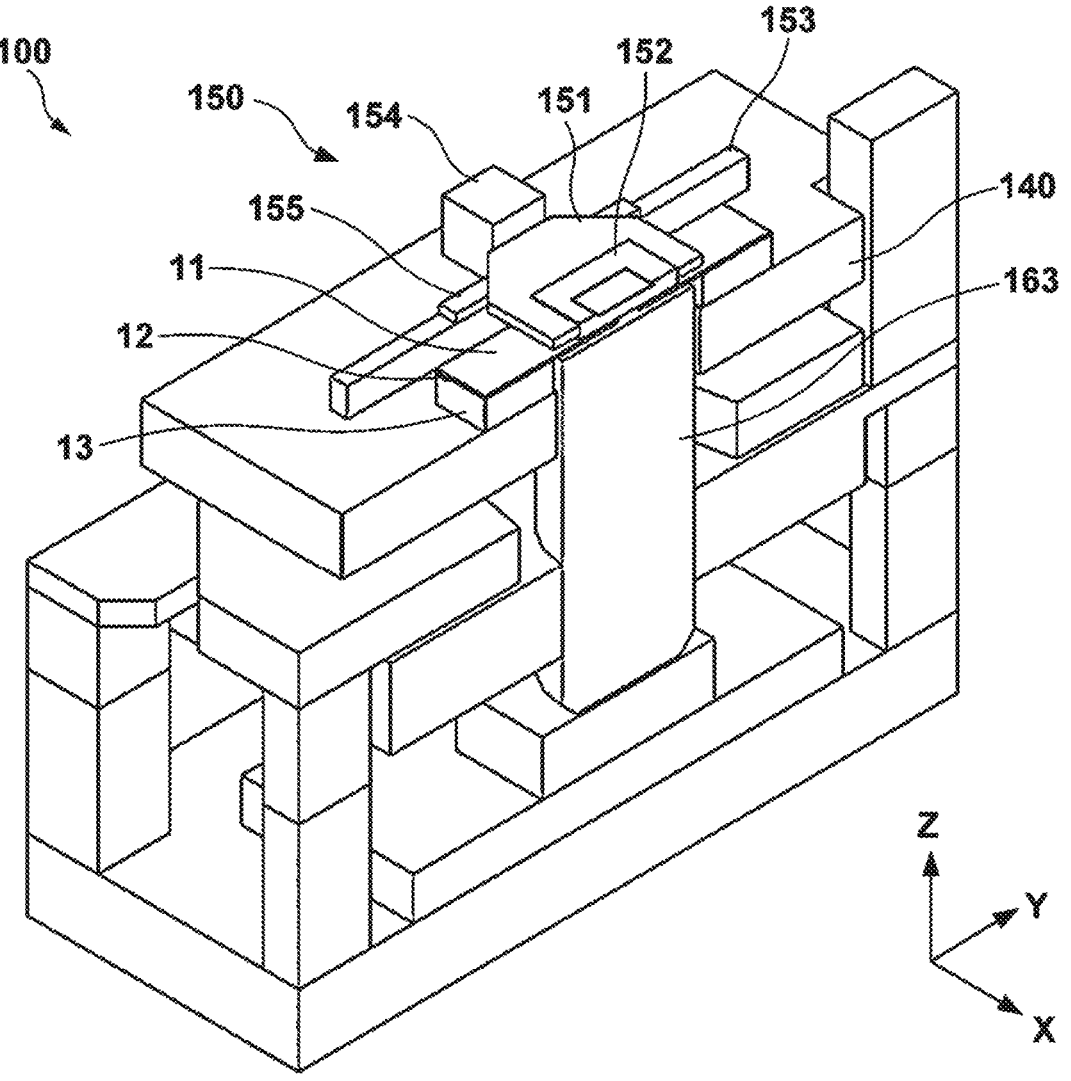
FIG. 1B is a view (sectional perspective view) showing the example of the arrangement of the exposure apparatus according to the first embodiment.
Figure 1C:
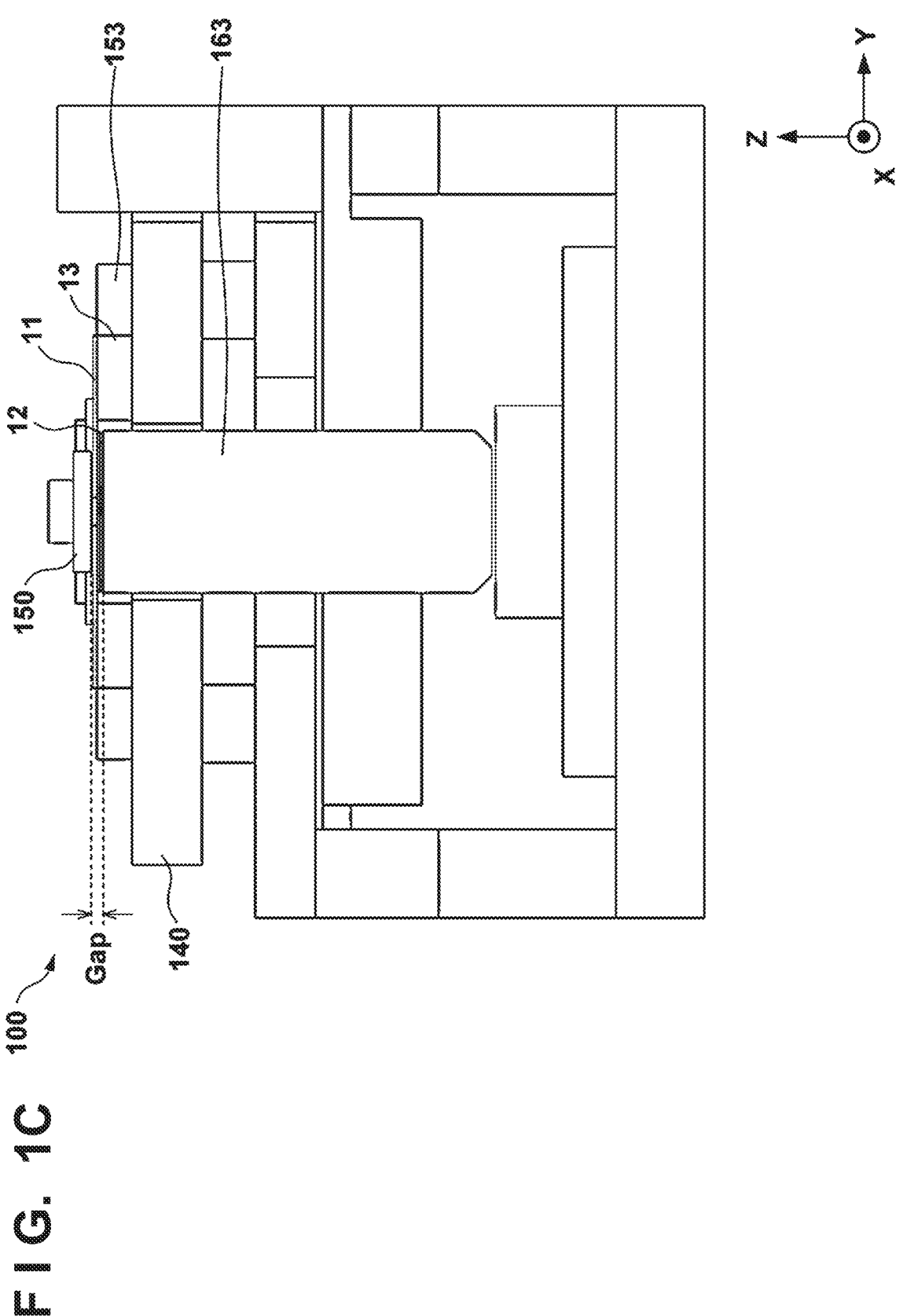
FIG. 1C is a view (sectional view) showing the example of the arrangement of the exposure apparatus according to the first embodiment.
Figure 1D:
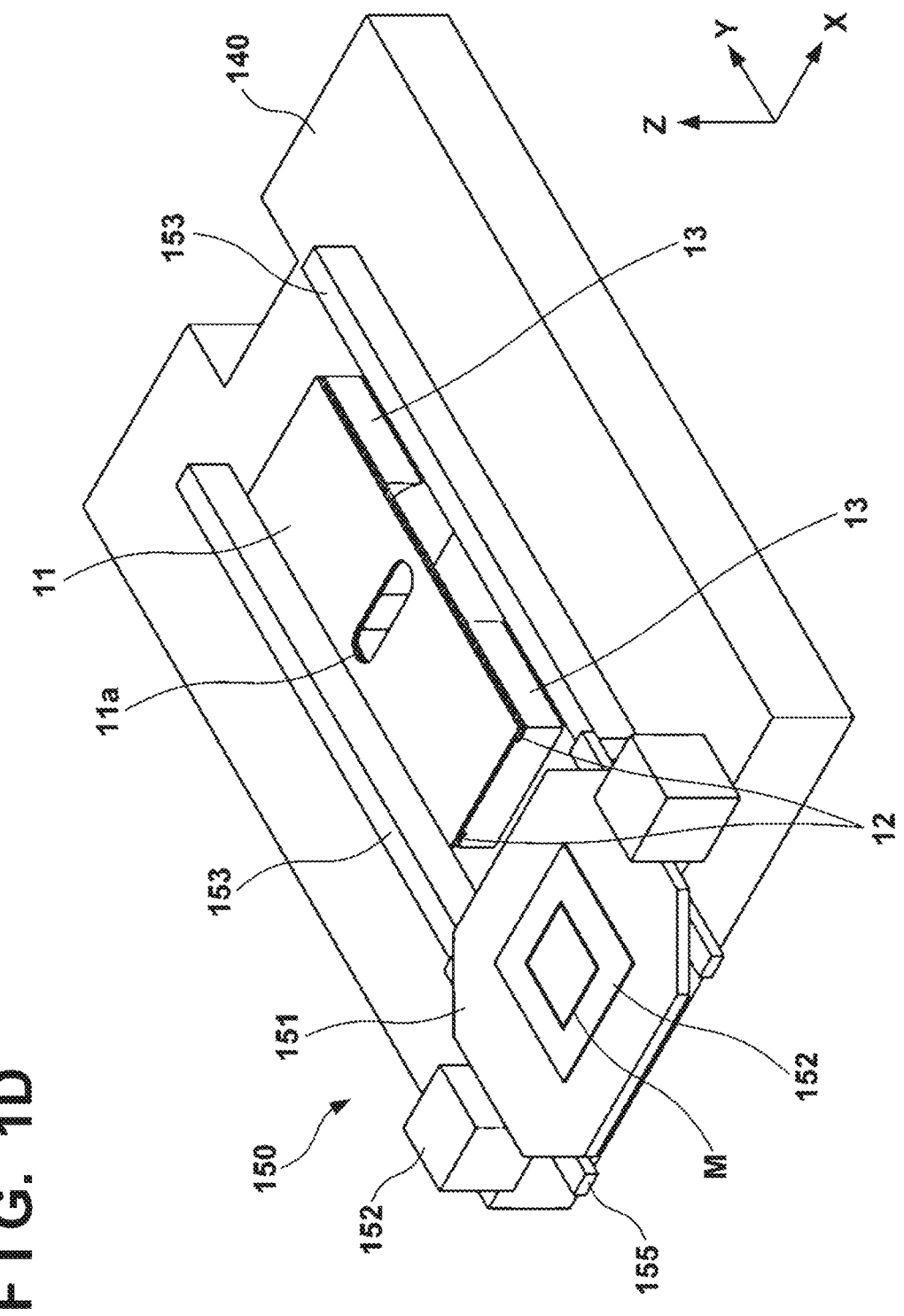
FIG. 1D is a view (enlarged view) showing the example of the arrangement of the exposure apparatus according to the first embodiment.

An example of the arrangement of an exposure apparatus 100 according to the first embodiment of the present invention will be described with reference to FIGS. 1A to 1D. FIGS. 1A to 1D are views showing an example of the arrangement of the exposure apparatus 100 of this embodiment. FIG. 1A is an overall perspective view, FIG. 1B is a sectional perspective view, and FIG. 1C is a sectional view. FIG. 1D is an enlarged view of the upper structure from an original stage base 140. Note that parts of the exposure apparatus 100 of this embodiment that are not described have the same structure as the conventional exposure apparatus 100c, so that a description thereof will be omitted below.

The exposure apparatus 100 of this embodiment includes a plate 11 and two (a plurality of) support members 12. The plate 11 and the two support members 12 may be understood as a structure forming a part of the exposure apparatus 100. Note that in this embodiment, the two support members 12 are provided. However, the number of the support members 12 is not limited to two and may be three or more.

The plate 11 is arranged between the moving path of an original stage 150 and a projection optical system 163 to reduce the influence on the projection optical system 163 by a wind pressure P generated by movement of the original stage 150. The plate 11 is arranged (formed) such that its longitudinal direction matches a direction (Y direction) in which the original stage 150 moves. The thickness of the plate 11 is appropriately set such that the plate 11 fits in a gap G (see FIG. 1C) between the lower end of the original stage 150 and the upper end of the projection optical system 163 in the Z direction. The plate 11 can be formed to be detachable from the two support members 12, that is, separatable from the two support members 12. Further, the plate 11 is provided with a window portion 11a (opening portion or slit portion) for transmitting slit light from an original M. The slit light transmitted through the window portion 11a enters the projection optical system 163. Here, in the example shown in FIGS. 1A to 1D, the width of the plate 11 in the X direction is smaller than the width of the projection optical system 163, but may be larger than the width of the projection optical system 163. If the width of the plate 11 in the X direction is smaller than the width of the projection optical system 163, the plate 11 can be formed to be lightweight so that the plate 11 can be more easily attached and detached during the manufacture, maintenance, and the like of the apparatus. On the other hand, if the width of the plate 11 in the X direction is larger than the width of the projection optical system 163, the influence of the wind pressure P on the projection optical system 163 can be reduced more.

Each of the two support members 12 is arranged so as to extend along the lower surface of the plate 11, and formed so as to support the plate 11 by contacting the lower surface of the plate 11. In this embodiment, each of the two support members 12 can be formed so as to extend in a direction (Y direction) in which the original stage 150 moves. Further, the two support members 12 can be arranged spaced apart from each other in a direction (for example, X direction) orthogonal to (intersecting) a direction in which the original stage 150 moves so as to sandwich the optical path of slit light passing through the original M and entering the projection optical system 163. Here, the two support members 12 are fixed (connected) to the original stage base 140 via fixing members 13. A plurality of (in this embodiment, two) fixing members 13 can be arranged so as to sandwich the projection optical system 163 (protrusion portion 163a) in a direction (Y direction) in which the original stage 150 moves. The fixing member 13 is a member for fixing the two support members 12 to the original stage base 140, and connected to the end portion of each of the two support members 12. The fixing member 13 may be understood as a member for connecting the two support members 12 and the original stage base 140. Note that the fixing members 13 can be included in the structure forming a part of the exposure apparatus 100 together with the plate 11 and the two support members 12.

The two support members 12 can be arranged so as to pass between the moving path of the original stage 150 and the projection optical system 163. That is, the two support members 12 can be arranged in the gap G between the lower end of the original stage 150 and the upper end of the projection optical system 163 in the Z direction. In this case, the thickness of the central portion of each support member 12 (the portion arranged above the projection optical system 163) is limited by the gap G, but the thickness of the end portion of each support member 12 is not limited. Therefore, from the viewpoint of improving the rigidity and strength of each support member 12, each support member 12 is preferably formed such that the end portion is thicker than the central portion in the longitudinal direction (Y direction). In this manner, by providing the thickness distribution such that the end portion is thicker than the central portion in each support member 12, the plate 11 can be supported more rigidly by each support member 12. That is, the rigidity and strength of the structure formed by the plate 11 and the support members 12 can be improved.

Note that each support member 12 may be formed integrally with each fixing member 13. In this case, it can be interpreted that the end portion is formed thicker than the central portion in the longitudinal direction. The two support members 12 are not limited to be arranged so as to pass between the moving path of the original stage 150 and the projection optical system 163, and may be arranged so as to sandwich the upper portion (for example, protrusion portion 163a) of the projection optical system 163 in the X direction.

Each support member 12 may be made of the same material (quality of material) as the plate 11, but is preferably made of a material different from the material of the plate 11, more specifically, a material having a higher rigidity and/or strength than the plate 11. In addition, each support member 12 is preferably made of a material having a larger specific gravity than the plate 11. In other words, the plate 11 is preferably made of a material having a smaller specific gravity than each support member 12. With this, the plate 11 can be formed to be lightweight while the rigidity and strength of the structure formed by the plate 11 and the support members 12 can be improved. That is, it is possible to achieve both reducing the influence of the wind pressure P on the projection optical system 163 and facilitating attachment and detachment of the plate 11.

The plate 11 and the respective support members 12 can be arranged between two guide rails 153 in the X direction. Each of the two guide rails 153 is the stator of a linear motor that drives the original stage 150 (coarse moving stage 151) as has been described above, and arranged (extended) on the original stage base 140 so as to extend along the direction (Y direction) in which the original stage 150 moves. With this arrangement, the plate 11 and the respective support members 12 can be arranged so as to effectively reduce the influence of the wind pressure P on the projection optical system 163 without changing the arrangement of the conventional exposure apparatus 100c. Furthermore, in this arrangement, the projection optical system 163 (protrusion portion 163a) is surrounded by the plate 11 and two guide rails 153. Therefore, with respect to the projection optical system 163, not only the influence of the wind pressure P generated by movement of the original stage 150 but also the influence of a wind pressure and the like generated by driving of another member in the exposure apparatus 100 can be reduced.

Here, in the exposure apparatus 100, if the upper surface of the plate 11 and the traveling surface of the original stage 150 are arranged in a non-parallel state (for example, in a wedge shape), the wind pressure in the Z direction generated by movement of the original stage 150 increases, and the influence of the wind pressure on the plate 11 can increase. Therefore, in the exposure apparatus 100, it is important to ensure the parallelism between the upper surface of the plate 11 and the traveling surface of the original stage 150. For this, with the upper surface of the original stage base 140 as the reference, the parallelism between the upper surfaces of the guide rails 153 and the traveling surface of the original stage 150 is ensured, and the parallelism of the plate 11, the support members 12, and the fixing members 13 with respect to the traveling surface of the original stage 150 is ensured. Hence, in this embodiment the support members 12 and the fixing members 13 are installed (fixed) on the original stage base 140.

As has been described above, in the exposure apparatus 100 of this embodiment, the plate 11 arranged between the moving path of the original stage 150 and the projection optical system 163 and the two support members 12 supporting the plate 11 are provided. Each of the two support members 12 is arranged so as to extend along the lower surface of the plate 11, and formed so as to support the plate 11 by contacting the lower surface of the plate 11. With this, the rigidity and strength of the structure formed by the plate 11 and the support members 12 can be improved, so that it is possible to reduce vibration of the plate 11 itself and the projection optical system 163 due to the wind pressure P generated by movement of the original stage 150. In addition, the plate 11 can be formed to be lightweight, so that the plate 11 can be more easily attached and detached during the manufacture, maintenance, and the like of the apparatus.

Second Embodiment

Figure 2:
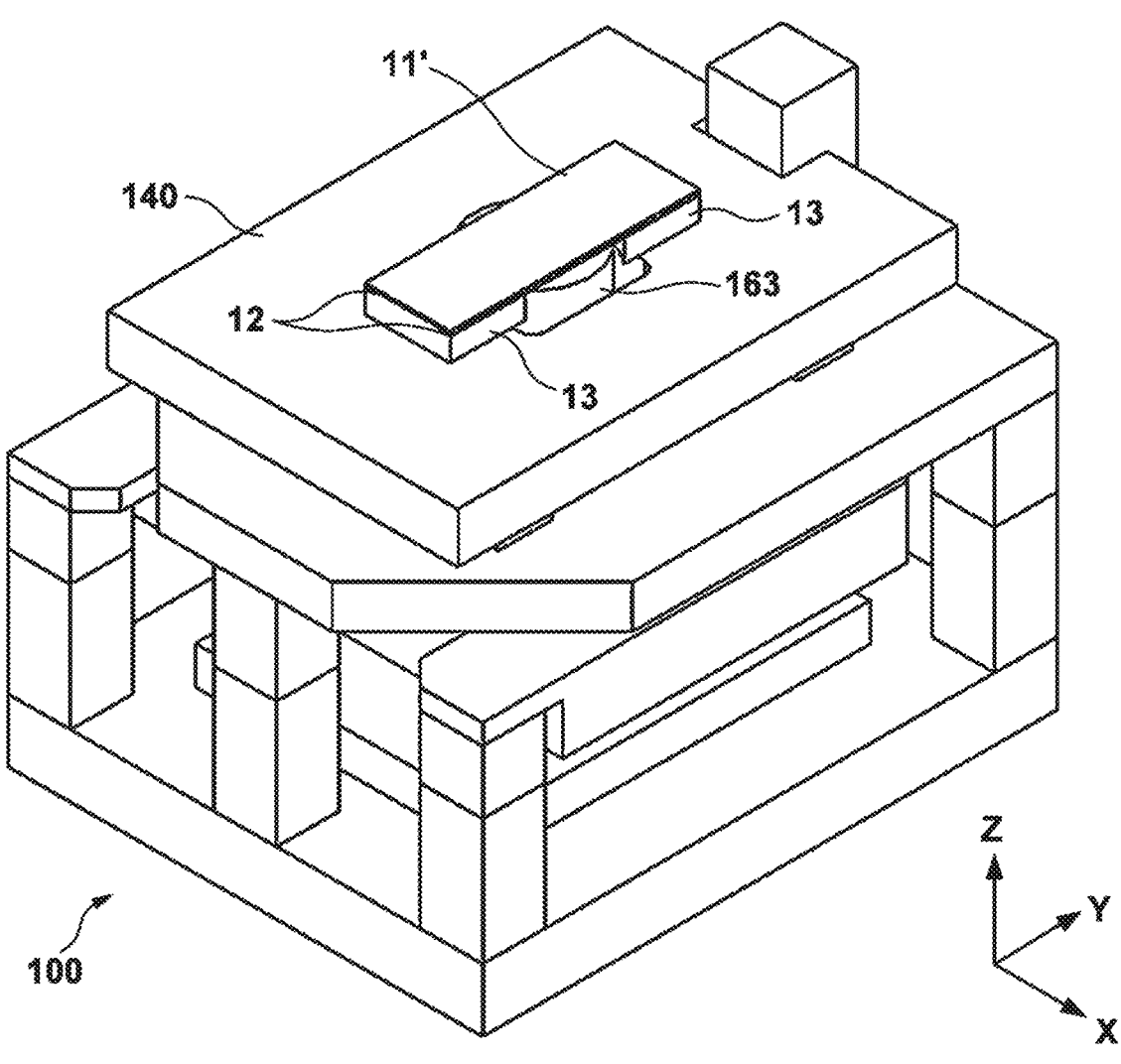
FIG. 2 is a view showing an example of the arrangement of an exposure apparatus according to the second embodiment.

The second embodiment according to the present invention will be described. This embodiment basically takes over the first embodiment, and matters not mentioned below can follow the first embodiment. FIG. 2 is a view showing an example of the arrangement of an exposure apparatus 100 according to this embodiment. For the sake of illustrative simplicity, some parts (for example, an original stage 150 and the like) are not shown in FIG. 2. These parts have the same structure as the conventional exposure apparatus or the exposure apparatus of the first embodiment.

In this embodiment, the structure of the plate 11 is different from that in the first embodiment. More specifically, the plate 11 of the first embodiment has a structure provided with the window portion 11a (opening portion or slit portion) in the portion for transmitting slit light. To the contrary, for a plate 11' of this embodiment, as shown in FIG. 2, the entire plate 11' is formed by a light transmissive member (light transmitting material) such as glass which transmits slit light. With the plate 11 of the first embodiment, there is a concern that the wind pressure P having passed through the window portion 11a influences the projection optical system 163, but this concern can be eliminated by using the plate 11' of this embodiment which is entirely formed by the light transmissive member.

Third Embodiment

Figure 3:
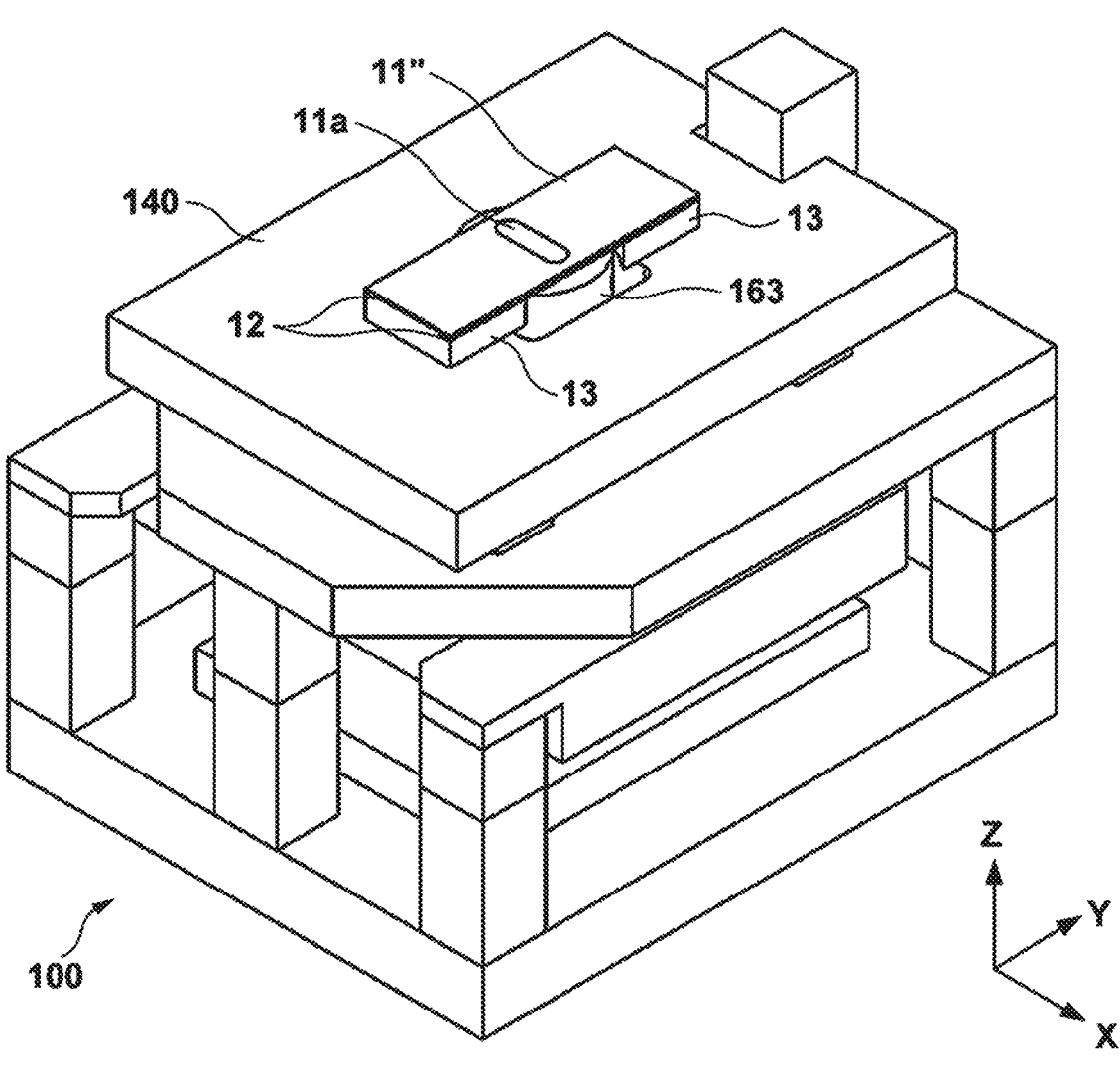
FIG. 3 is a view showing an example of the arrangement of an exposure apparatus according to the third embodiment.

The third embodiment according to the present invention will be described. This embodiment basically takes over the first embodiment, and matters not mentioned below can follow the first embodiment. FIG. 3 is a view showing an example of the arrangement of an exposure apparatus 100 according to this embodiment. For the sake of illustrative simplicity, some parts (for example, an original stage 150 and the like) are not shown in FIG. 3. These parts have the same structure as the conventional exposure apparatus or the exposure apparatus of the first embodiment.

In this embodiment, the structure of the plate 11 is different from that in the first embodiment. More specifically, in the plate 11 of the first embodiment, the window portion 11a is formed as the opening portion (slit portion). To the contrary, in a plate 11" of this embodiment, a light transmissive member such as glass which transmits slit light is provided in a window portion 11a as shown in FIG. 3. That is, the window portion 11a is closed (covered) with the light transmissive member. By providing the light transmissive member in the window portion 11a in this manner, the concern that a wind pressure P having passed through the window portion 11a influences a projection optical system 163 can be eliminated, as in the second embodiment.

Fourth Embodiment

Figure 4:
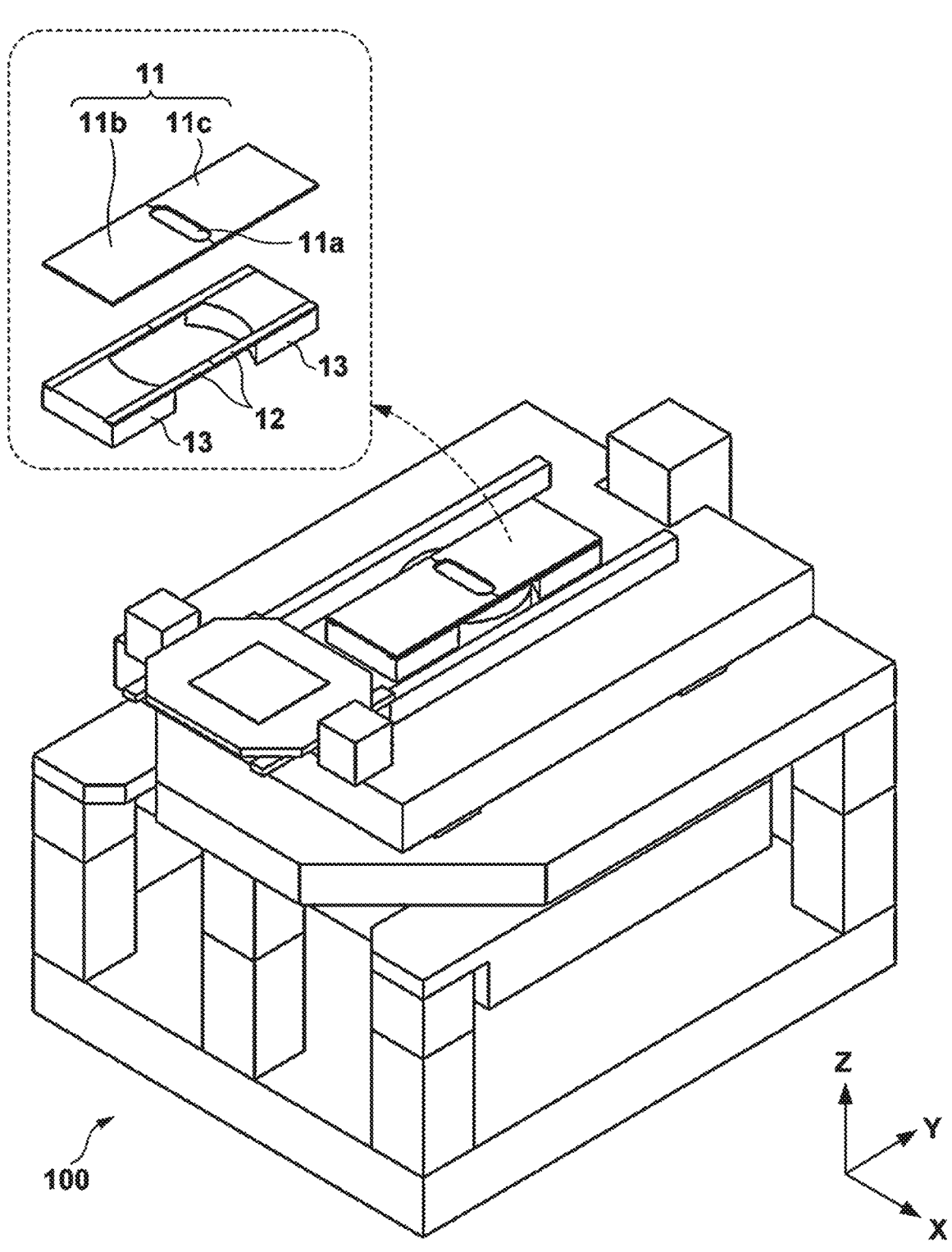
FIG. 4 is a view showing an example of the arrangement of an exposure apparatus according to the fourth embodiment.

The fourth embodiment according to the present invention will be described. This embodiment basically takes over the first embodiment, and matters not mentioned below can follow the first embodiment. The second embodiment or the third embodiment may be applied to this embodiment. FIG. 4 is a view showing an example of the arrangement of an exposure apparatus 100 according to this embodiment. For the sake of illustrative simplicity, some parts are not shown in FIG. 4. These parts have the same structure as the conventional exposure apparatus or the exposure apparatus of the first embodiment.

In this embodiment, an example in which the plate 11 is divided into a plurality of partial regions will be described. More specifically, as shown in FIG. 4, a plate 11 of this embodiment is divided into a plurality of partial regions including a first partial region 11b and a second partial region 11c. The first partial region 11b is a region including a part of a window portion 11a, and the second partial region 11c is a portion including the remaining part of the window portion 11a. The plurality of partial regions 11b and 11c in the plate 11 are formed to be individually separatable from a support member 12. By dividing the plate 11 in this manner, each partial region can be formed to be lightweight, so that the plate 11 can be more easily attached/detached during the manufacture, maintenance, and the like of the apparatus. In addition, the plate 11 can be easily attached/detached without removing an original stage 150. For example, by moving the original stage 150 in the +Y direction, access to (attachment/detachment of) the first partial region 11b of the plate 11 becomes easy, and by moving the original stage 150 in the −Y direction, access to (attachment/detachment of) the second partial region 11c of the plate 11 becomes easy.

Further, in this embodiment, each support member 12 may also be divided into a plurality of partial regions, as shown in FIG. 4. With this, the degree of freedom in design of the support member 12 can be improved. For example, in a case where the upper surface of a projection optical system 163 includes a local protrusion and the height of the protrusion changes depending on location, it is easy to provide a concave portion or opening portion to avoid the protrusion or locally change the thickness in each support member 12. Further, it is possible to provide a gap between the plurality of partial regions in each support member 12. In this case, the support rigidity of the plate 11 slightly deteriorates, but the interference among the plurality of partial regions in each support member 12 can be reduced during assembling. That is, assemblability can be improved.

Fifth Embodiment

Figure 5:
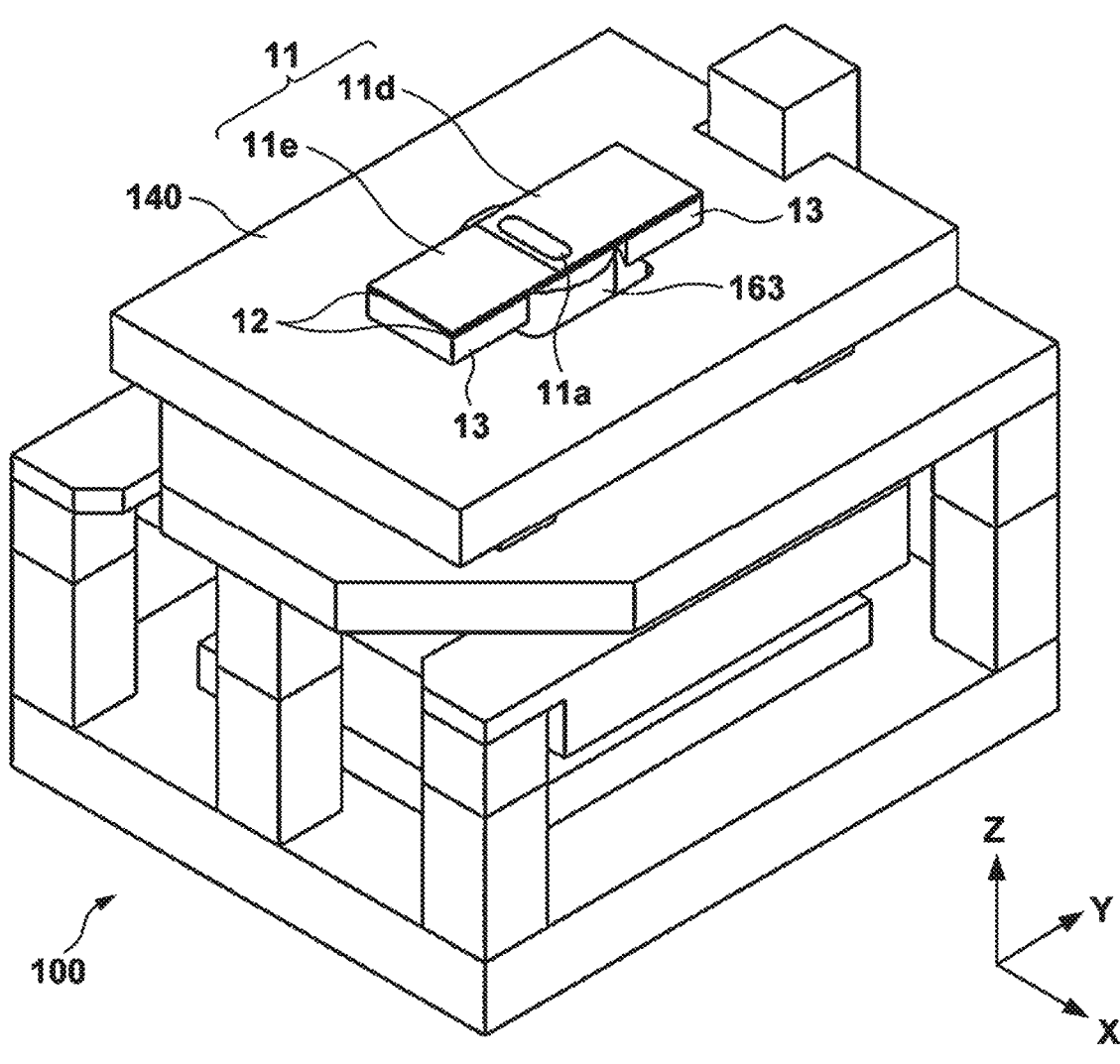
FIG. 5 is a view showing an example of the arrangement of an exposure apparatus according to the fifth embodiment.

The fifth embodiment according to the present invention will be described. This embodiment basically takes over the first embodiment, and matters not mentioned below can follow the first embodiment. The second embodiment or the third embodiment may be applied to this embodiment. FIG. 5 is a view showing an example of the arrangement of an exposure apparatus 100 according to this embodiment. For the sake of illustrative simplicity, some parts are not shown in FIG. 5. These parts have the same structure as the conventional exposure apparatus or the exposure apparatus of the first embodiment.

In this embodiment, another example in which the plate 11 is divided into a plurality of partial regions will be described. In the fourth embodiment described above, the example has been described in which the plate 11 is symmetrically (equally) divided, but in this embodiment, an example will be described in which the plate 11 is asymmetrically (unequally) divided. More specifically, a plate 11 of this embodiment is divided into a plurality of partial regions 11d and 11e as shown in FIG. 5. The partial region 11d has a larger area than the partial region 11e, and includes the whole of a window portion 11a. With this, as has been described in the third embodiment described above, it is possible to provide a light transmissive member in the window portion 11a. In this case, in addition to the effect of the fourth embodiment described above, the effect of the third embodiment described above can also be obtained.

Sixth Embodiment

Figure 6:
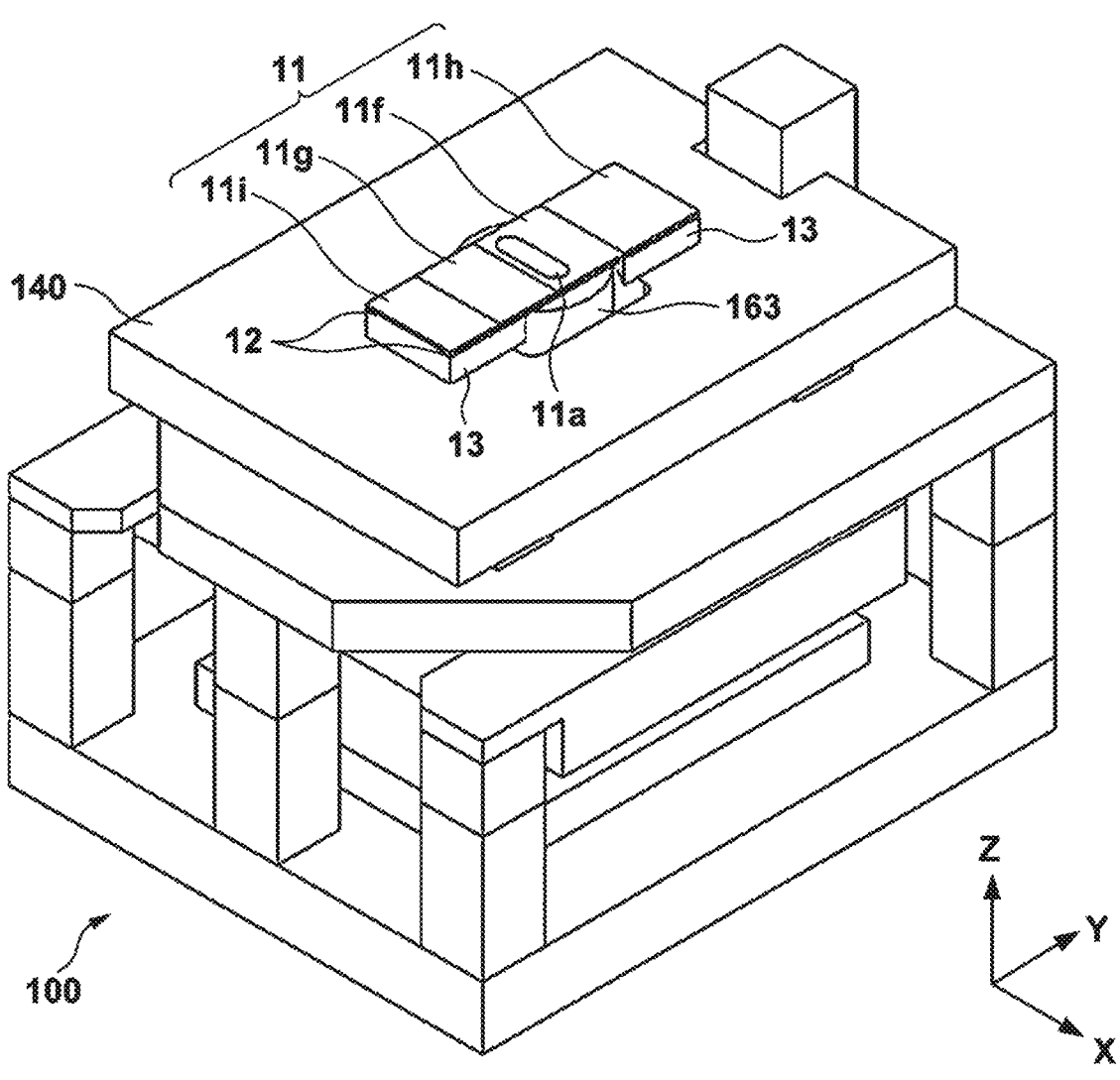
FIG. 6 is a view showing an example of the arrangement of an exposure apparatus according to the sixth embodiment.

The sixth embodiment according to the present invention will be described. This embodiment basically takes over the first embodiment, and matters not mentioned below can follow the first embodiment. The second embodiment or the third embodiment may be applied to this embodiment. FIG. 6 is a view showing an example of the arrangement of an exposure apparatus 100 according to this embodiment. For the sake of illustrative simplicity, some parts are not shown in FIG. 6. These parts have the same structure as the conventional exposure apparatus or the exposure apparatus of the first embodiment.

In this embodiment, an example is shown in which the plate 11 is further divided into a plurality of (four) partial regions 11f to 11i, as shown in FIG. 6. By further dividing the plate 11 into the plurality of partial regions in this manner, each partial region can be formed to be even more lightweight, so that the plate 11 can be more easily attached/detached during the manufacture, maintenance, and the like of the apparatus. Here, in the example shown in FIG. 6, the plate 11 is provided in the four partial regions 11f to 11i such that a window portion 11a is provided only in the partial region 11f, but the present invention is not limited to this. As has been described in the fourth embodiment described above, the window portion 11a may be provided over two partial regions. The number of the partial regions to divide the plate is not limited to four, and may be three, or five or more.

Seventh Embodiment

Figure 7A:
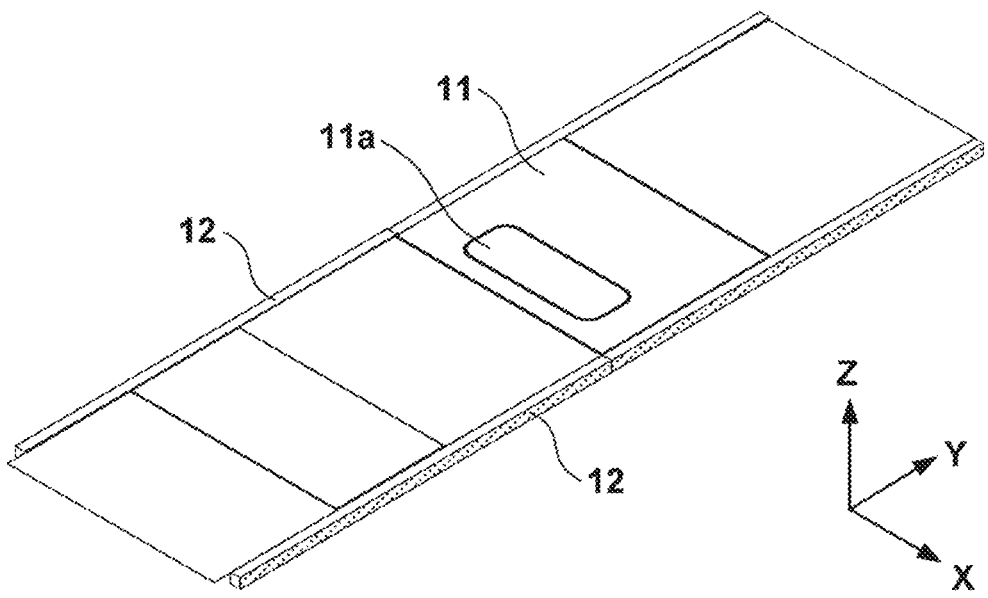
FIGS. 7A and 7B are views showing an example of the arrangement of a plate and two support members according to the seventh embodiment.
Figure 7B:
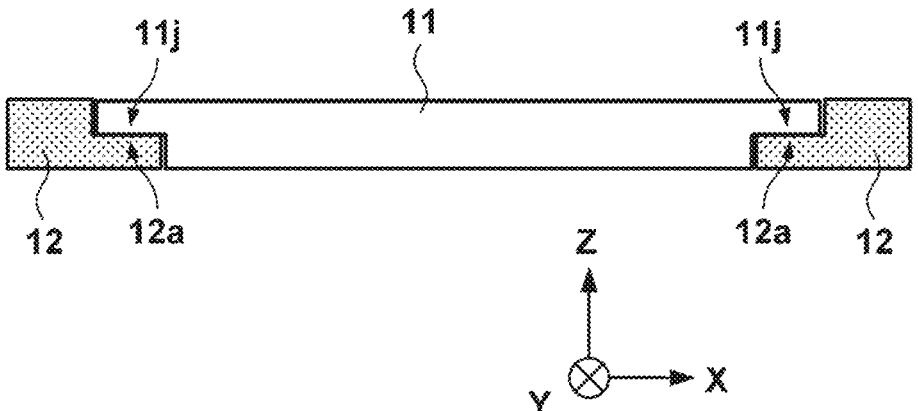

The seventh embodiment according to the present invention will be described. This embodiment basically takes over the first embodiment, and matters not mentioned below can follow the first embodiment. The second to sixth embodiments may be applied to this embodiment. In this embodiment, an example of a positioning mechanism of a plate 11 with respect to two support members 12 will be described. FIGS. 7A and 7B are views showing an example of the arrangement of the plate 11 and two support members 12. FIG. 7A is a perspective view, and FIG. 7B is a sectional view. FIGS. 7A and 7B show an example in which the plate 11 is divided into a plurality of (four) partial regions. However, the present invention is not limited to this, and the plate 11 may not be divided.

Each of the two support members 12 includes, in the side surface on the side of the optical path of slit light, a groove portion 12a into which the plate 11 is fitted. When the plate 11 is fitted into the groove portion 12a of each support member 12 in this manner, it is possible to accurately position the plate 11 with respect to each support member 12 fixed to an original stage base 140. That is, it is possible to accurately position the plate 11 with respect to the original stage base 140 and a projection optical system 163. In addition, when arranging the plate 11 on the two support members 12, the plate 11 is simply fitted into the groove portions 12a of the two support members 12. Thus, the assemblability during the manufacture and maintenance of the apparatus can be improved.

Here, as shown in FIG. 7B, the plate 11 of this embodiment may be provided with a notch portion 11j in the portion to be fitted into the groove portion 12a of each support member 12. The notch portion 11*j* can be formed such that the upper surface of the plate 11 becomes flush with the upper surface of each support member 12. With this arrangement, it is possible to reduce the entire thickness of the structure while ensuring the rigidity and strength of a structure formed by the plate 11 and the support members 12. That is, it is possible to appropriately arrange the structure in a small gap G between the moving path of an original stage 150 and the projection optical system 163.

<Embodiment of Article Manufacturing Method>

An article manufacturing method according to the embodiment of the present invention is suitable for manufacturing an article, for example, a microdevice such as a semiconductor device or an element having a microstructure. The article manufacturing method according to this embodiment includes an exposure step of exposing a substrate (a step of transferring a pattern image on a substrate) by using the above-described exposure apparatus, a processing step of processing the substrate exposed in the exposure step, and a manufacturing step of manufacturing an article from the substrate processed in the processing step. The manufacturing method further includes other known steps (oxidation, film formation, deposition, doping, planarization, etching, resist removal, dicing, bonding, packaging, and the like). The article manufacturing method of this embodiment is more advantageous than the conventional methods in at least one of the performance, quality, productivity, and production cost of the article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2023-086427 filed on May 25, 2023, which is hereby incorporated by reference herein in its entirety.

What is claimed is:

1. A structure forming a part of an exposure apparatus that includes a stage configured to move on a base while holding an original, and a projection optical system configured to project a pattern image of the original onto a substrate, the structure comprising:

a plate arranged between a moving path of the stage and the projection optical system; and a plurality of support members arranged extending along a lower surface of the plate and configured to support the plate by contacting the lower surface, wherein each of the plurality of support members extends in a direction along the moving path of the stage, and wherein each of the plurality of support members extends for a length at least equal to the length of the plate.

2. The structure according to claim 1, wherein the plurality of support members are fixed to the base.

3. The structure according to claim 2, further comprising a fixing member connected to an end portion of each of the plurality of support members, wherein the plurality of support members are fixed to the base via the fixing member.

4. The structure according to claim 1, wherein the plurality of support members are arranged so as to sandwich an optical path of light passing through the original and entering the projection optical system.

5. The structure according to claim 1, wherein two rails configured to guide movement of the stage are arranged on the base, and the plate and the plurality of support members are arranged between the two rails.

6. The structure according to claim 5, wherein the projection optical system is arranged extending through the base so as to have a protrusion portion protruding from the base toward a side of the original, and the two rails are arranged on the base so as to sandwich the protrusion portion of the projection optical system.

7. The structure according to claim 6, wherein the plurality of support members are fixed to the base via two fixing members arranged so as to sandwich the protrusion portion of the projection optical system in a direction in which the stage moves.

8. The structure according to claim 1, wherein each of the plurality of support members is formed so as to extend along a direction in which the stage moves.

9. The structure according to claim 8, wherein the plate is arranged such that a longitudinal direction of the plate matches the direction in which the stage moves.

10. The structure according to claim 1, wherein each of the plurality of support members includes a groove portion into which the plate is fitted.

11. The structure according to claim 10, wherein the plurality of support members are arranged so as to sandwich an optical path of light from the original, and the groove portion is provided in a side surface of each of the plurality of support members on a side of the optical path.

12. The structure according to claim 1, wherein each of the plurality of support members is formed such that an end portion is thicker than a central portion in a longitudinal direction of each support member.

13. The structure according to claim 1, wherein
the plate includes a window portion through which light
from the original passes.

14. The structure according to claim 1, wherein
the plate is formed by a member that transmits light from
the original.

15. The structure according to claim 1, wherein
the plate is divided into a plurality of partial regions.

16. The structure according to claim 15, wherein
the plate includes a window portion through which light
from the original passes, and
the plurality of partial regions in the plate include a first
partial region including a part of the window portion,
and a second partial region including a remaining part
of the window portion.

17. The structure according to claim 1, wherein
the plate is formed to be separatable from the plurality of
support members.

18. An exposure apparatus that exposes a substrate, the
apparatus comprising:
a stage configured to move while holding an original;
a projection optical system configured to project a pattern
image of the original onto the substrate; and
a structure defined in claim 1.

19. An article manufacturing method comprising:
exposing a substrate by using an exposure apparatus
defined in claim 18;
processing the substrate having undergone the exposing;
and
manufacturing an article from the substrate having under-
gone the processing.

* * * * *